United States Patent

Enrici et al.

(10) Patent No.: US 12,316,692 B2
(45) Date of Patent: May 27, 2025

(54) MANAGEMENT AND IMPLEMENTATION OF APPLICATIONS IN CLOUD-BASED FPGAS

(71) Applicant: Nokia Solutions and Networks Oy, Espoo (FI)

(72) Inventors: Andrea Enrici, Bourg la Reine (FR); Faycal Ait Aoudia, Saint-Cloud (FR); Julien Lallet, Lannion (FR)

(73) Assignee: Nokia Solutions and Networks Oy, Espoo (FI)

( * ) Notice: Subject to any disclaimer, the term of this patent is extended or adjusted under 35 U.S.C. 154(b) by 1091 days.

(21) Appl. No.: 17/081,464

(22) Filed: Oct. 27, 2020

(65) Prior Publication Data

US 2022/0131915 A1    Apr. 28, 2022

(51) Int. Cl.
| | |
|---|---|
| H04L 65/61 | (2022.01) |
| G06F 7/78 | (2006.01) |
| G06F 30/34 | (2020.01) |
| H04L 65/65 | (2022.01) |
| H04L 65/70 | (2022.01) |

(52) U.S. Cl.
CPC ............ *H04L 65/61* (2022.05); *G06F 7/78* (2013.01); *G06F 30/34* (2020.01); *H04L 65/65* (2022.05); *H04L 65/70* (2022.05)

(58) Field of Classification Search
CPC ......... H04L 65/61; H04L 67/70; H04L 65/65; G06F 30/34; G06F 7/78
See application file for complete search history.

(56) References Cited

U.S. PATENT DOCUMENTS 9,590,635 B1 * 3/2017 Sengupta ......... H03K 19/17744
10,657,060 B1   5/2020 Robinson

FOREIGN PATENT DOCUMENTS

WO    WO-2020/046645 A1    3/2020

OTHER PUBLICATIONS

"Amazon AWS marketplace," Retrieved from Internet: <https://aws.amazon.com/marketplace> on Sep. 21, 2020.
"Huawei Cloud marketplace," Retrieved from Internet: <https://marketplace-intl.huaweicloud.com>> on Sep. 21, 2020.
(Continued)

*Primary Examiner* — Wissam Rashid
(74) *Attorney, Agent, or Firm* — Harness, Dickey & Pierce, P.L.C.

(57) ABSTRACT

A network-based apparatus includes at least one processor and at least one memory including computer program code. The at least one memory and the computer program code are configured to, with the at least one processor, cause the network-based apparatus to: select at least a first bitstream from a central repository based on an indicator associated with a probability of concurrent, simultaneous or future execution of the first bitstream and a second bitstream at a network node, each of the first bitstream and the second bitstream including programming information for a device at the network node, the indicator being based on an embedding matrix mapping at least a subset of bitstreams in the central repository to an N-dimensional vector of real numbers; and output the first bitstream to the network node for storage and execution upon request.

20 Claims, 9 Drawing Sheets

(56) References Cited

OTHER PUBLICATIONS

"Oracle Cloud marketplace," Retrieved from Internet: <https://cloudmarketplace.oracle.com/marketplace/en_US/homePage.jspx> on Sep. 21, 2020.
Sami Alabed, "RLCache: Automated Cache Management Using Reinforcement Learning," University of Cambridge, Oct. 1, 2019, United Kingdom.
Giuseppe Vietri, et al., "Driving Cache Replacement with ML-based LeCaR," HotStorage'18: Proceedings of the 10th USENIX Conference on Hot Topics in Storage and File Systems, Jul. 2018.
Zhan Shi et al., "Applying Deep Learning to the Cache Replacement Problem," Micro-52, Oct. 12-16, 2019, Columbus, OH.
Vadim Kirilin et al., "RL-Cache: Learning-Based Cache Admission for Content Delivery," NetAI, Aug. 23, 2019, Beijing, China.
Youngbin Im et al., "SNN-cache: A practical machine learning-based caching system utilizing the inter-relationships of requests," IEEE: 2018 52nd Annual Conference on Information Sciences an Systems (CISS), Mar. 21-23, 2018.
Sarina Sulaiman et al., "Intelligent Web Caching Using Machine Learning Methods," Neural Network World, pp. 429-452, Jan. 2011.
Tomas Mikolov et al., "Efficient Estimation of Word Representations in Vector Space," Cornell University, arXiv.org > cs > arXiv:1301.3781, Sep. 7, 2013.
Extended European Search Report dated Mar. 21, 2022.
European Office Action dated Apr. 19, 2024 issued in corresponding European Appln. No. 21204835.9.

\* cited by examiner

| FPGA Model | Provider | Shell Type | Partition ID | Bitstream | Bitstream Pointer | VBit | FCounter |
|---|---|---|---|---|---|---|---|
| Model A | COMPANY A | 3U_TYPE | 0x1 | | 0xAB98 | 1 | 5 |
| Model B | COMPANY B | 4U_TYPE | 0x4 | | 0xACC01 | 0 | 2 |

FIG. 4

MANAGEMENT AND IMPLEMENTATION OF APPLICATIONS IN CLOUD-BASED FPGAS

BACKGROUND

A field-programmable gate array (FPGA) is an integrated circuit designed to be configured and re-configured after manufacture. FPGAs contain an array of Configurable Logic Blocks (CLBs), and a hierarchy of reconfigurable interconnects that allow these blocks to be wired together, like many logic gates that can be inter-wired in different configurations. CLBs can be configured to perform complex combinational functions, or simple logic gates like AND XOR. CLBs also include memory blocks, which may be simple flip-flops or more complete blocks of memory, and specialized Digital Signal Processing blocks (DSPs) configured to execute some common operations (e.g., filters).

SUMMARY

The scope of protection sought for various example embodiments of this disclosure is set out by the independent claims. The example embodiments and/or features, if any, described in this specification that do not fall under the scope of the independent claims are to be interpreted as examples useful for understanding various embodiments.

At least one example embodiment provides a network-based apparatus comprising at least one processor and at least one memory including computer program code. The at least one memory and the computer program code are configured to, with the at least one processor, cause the network-based apparatus to: select at least a first bitstream from a central repository based on an indicator associated with a probability of concurrent, simultaneous or future execution of the first bitstream and a second bitstream at a network node, each of the first bitstream and the second bitstream including programming information for a device (e.g., a field programmable gate array (FPGA)) at the network node, the indicator being based on an embedding matrix mapping at least a subset of bitstreams in the central repository to an N-dimensional vector of real numbers; and output the first bitstream to the network node for storage and execution upon request.

At least one example embodiment provides a network-based apparatus comprising: means for selecting at least a first bitstream from a central repository based on an indicator associated with a probability of concurrent, simultaneous or future execution of the first bitstream and a second bitstream at a network node, each of the first bitstream and the second bitstream including programming information for a device (e.g., a field programmable gate array (FPGA)) at the network node, the indicator being based on an embedding matrix mapping at least a subset of bitstreams in the central repository to an N-dimensional vector of real numbers; and means for outputting the first bitstream to the network node for storage and execution upon request.

According to example embodiments, the embedding matrix may map bitstreams in the subset of bitstreams to the N-dimensional vector of real numbers. The at least one memory and the computer program code may be configured to, with the at least one processor, cause the network-based apparatus to: identify the subset of bitstreams from among the bitstreams in the central repository, the subset of bitstreams including at least the first bitstream and the second bitstream; and select the first bitstream from the subset of bitstreams.

The at least one memory and the computer program code may be configured to, with the at least one processor, cause the network-based apparatus to identify the subset of bitstreams based on one or more static characteristics associated with the second bitstream.

The one or more static characteristics may include at least one of shell type, application domain, FPGA Model or manufacturer or bitstream provider.

The at least one memory and the computer program code may be configured to, with the at least one processor, cause the network-based apparatus to identify the subset of bitstreams according to a decision tree.

The embedding matrix may map all bitstreams in the central repository to the N-dimensional vector of real numbers.

Each of the first bitstream and the second bitstream may be assigned a pointer based on the indicator. The at least one memory and the computer program code may be configured to, with the at least one processor, cause the network-based apparatus to select the first bitstream based on the pointers assigned to the first bitstream and the second bitstream.

The first bitstream may be stored in a cache at the network node. The at least one memory and the computer program code may be configured to, with the at least one processor, cause the network-based apparatus to: gather a list of bitstreams stored in the cache in response to storing the first bitstream in the cache at the network node; and update the embedding matrix based on the list of bitstreams stored in the cache.

At least one other example embodiment provides a method comprising: selecting at least a first bitstream from a central repository based on an indicator associated with a probability of concurrent, simultaneous or future execution of the first bitstream and a second bitstream at a network node, each of the first bitstream and the second bitstream including programming information for a device (e.g., a field programmable gate array (FPGA)) at the network node, the indicator being based on an embedding matrix mapping at least a subset of bitstreams in the central repository to an N-dimensional vector of real numbers; and outputting the first bitstream to the network node for storage and execution upon request.

At least one other example embodiment provides a non-transitory computer-readable storage medium storing computer-readable instructions that, when executed by at least one processor at a network-based apparatus, cause the network-based apparatus to perform a method comprising: selecting at least a first bitstream from a central repository based on an indicator associated with a probability of concurrent, simultaneous or future execution of the first bitstream and a second bitstream at a network node, each of the first bitstream and the second bitstream including programming information for a device (e.g., a field programmable gate array (FPGA)) at the network node, the indicator being based on an embedding matrix mapping at least a subset of bitstreams in the central repository to an N-dimensional vector of real numbers; and outputting the first bitstream to the network node for storage and execution upon request.

According to example embodiments, the embedding matrix may map bitstreams in the subset of bitstreams to the N-dimensional vector of real numbers, and the selecting may include: identifying the subset of bitstreams from among bitstreams stored in the central repository, the subset of bitstreams including at least the first bitstream and the second bitstream; and selecting the first bitstream from the subset of bitstreams.

According to example embodiments, the identifying may identify the subset of bitstreams based on one or more static characteristics associated with the second bitstream.

The one or more static characteristics may include at least one of shell type, application domain, FPGA Model or manufacturer or bitstream provider.

The identifying may identify the subset of bitstreams according to a decision tree.

The embedding matrix may map all bitstreams in the central repository to the N-dimensional vector of real numbers.

Each of the first bitstream and the second bitstream may be assigned a pointer based on the indicator. The selecting may select the first bitstream based on the pointers assigned to the first bitstream and the second bitstream.

The device may be a FPGA or other programmable device or programmable logic device.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of this disclosure.

FIG. 4 shows a generic internal architecture of a cache memory according to example embodiments.

Figure 1:
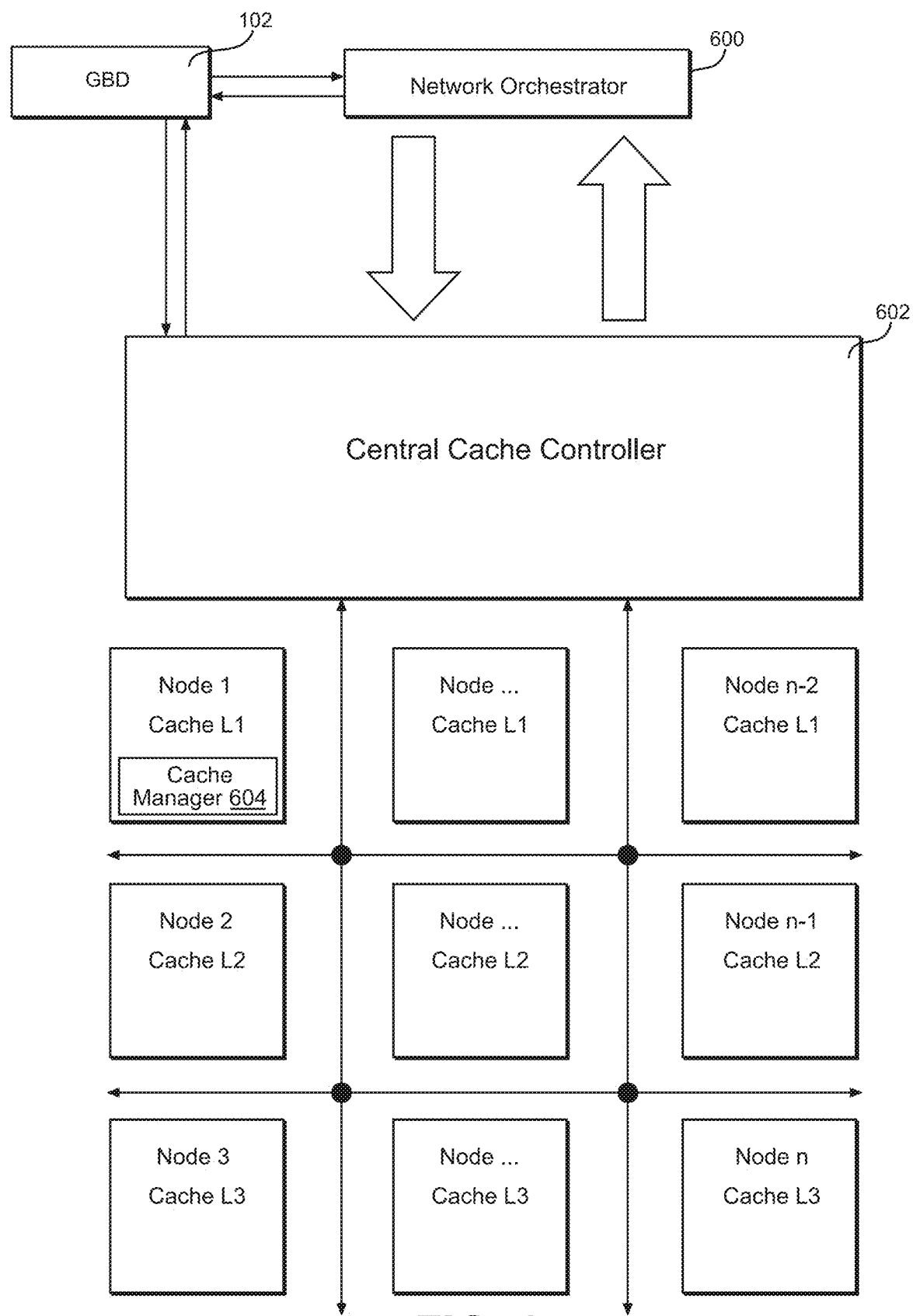
FIG. 1 illustrates a portion of a network architecture according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. The use of similar or identical reference numbers in the various drawings is intended to indicate the presence of a similar or identical element or feature.

DETAILED DESCRIPTION

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. The example embodiments may, however, be embodied in many alternate forms and should not be construed as limited to only the embodiments set forth herein.

Accordingly, while example embodiments are capable of various modifications and alternative forms, the embodiments are shown by way of example in the drawings and will be described herein in detail. It should be understood, however, that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

As discussed herein, the terms embedded and embedding in, for example, embedding (or embedded) matrix, embedding (embedded) space, may be used interchangeably.

In modern cloud-based data centers, servers are equipped with accelerators, such as graphics processing units (GPUs) and field-programmable gate arrays (FPGAs), to accelerate the execution of data-intensive services (e.g., video processing, financial analysis, bioinformatics, etc.). So far, current datacenters do not allow the sharing of FPGAs among multiple tenants (users) at run-time. However, a multi-tenant architecture is being currently developed in the context of some European projects. Apart from the evident technical advantages, multi-tenancy may allow network operators and/or manufacturers to generate more revenue than in the single-tenant case because the same reconfigurable hardware resource (e.g., FPGA) may be rented to multiple users.

A FPGA bitstream is a file that contains programming information for a FPGA. More specifically, a FPGA bitstream contains a design that implements an application or function (e.g., tasks and input data to process), and is used to configure a FPGA to execute the application or function. Bitstreams may be designed offline for specific spatial partitions of a FPGA. Bitstreams cannot be executed by any FPGA in a datacenter, but are specific to FPGAs that have been partitioned in compatible regions.

In a network with multi-tenant FPGAs, each time a user is granted access to a portion of the FPGA at a network node (e.g., as part of a virtual machine or a container), a bitstream is sent over the network to the network node or retrieved from a storage facility (e.g., a bitstream database) by the network node. Once the FPGA is configured, the bitstream may be retained for later use (e.g., in a local cache at the network node) or discarded.

A cloud marketplace provides customers with access to software applications and services that are built on, integrate with, or complement, a cloud provider's offerings. A marketplace provides customers with native cloud applications and approved applications created by third-party developers.

A marketplace allows cloud providers to enrich their portfolio of niche applications developed by users and to meet the needs of more customers by offering a relatively large variety of services. From the perspective of users, a marketplace allows to reduce the time-to-market of new products since, for example, prototypes may be tested in an environment that guarantees safe and smooth integration with existing cloud products. From the joint perspective of providers and customers, a cloud marketplace is a highly profitable, virtual, trade place. Here, cloud providers earn money by renting their infrastructure to users. Users that come up with clever applications can upload them to the marketplace and earn money by selling or renting applications to other users.

In a cloud marketplace, rapid access to applications is vital for both users and providers. Rapid access entails efficient storage architectures such as those based on caches. However, since applications are traded based on their popularity, not on the temporal and spatial locality principles, traditional memory cache memory systems based on these principles do not work efficiently in cloud marketplaces.

One or more example embodiments provide more efficient storage of applications in cache architectures (e.g., for cloud marketplaces) based on popularity (e.g., frequency of deployment) of applications.

One or more example embodiments also provide cache management solutions for FPGA bitstreams or other network services. Although example embodiments are discussed herein with regard to FPGA bitstreams, example embodiments should not be limited to this example. Rather, example embodiments may be applicable to any kind of network service regardless of its execution format (e.g., execution files for CPUs, GPUs, Tensor Processor Units, bitstreams for FPGAs, etc.).

According to one or more example embodiments, bitstreams deemed likely to be used together may be assigned similar (close) references or pointers so that the bitstreams are loaded in the same cache memory when one of the bitstreams is required (e.g., to execute an application based on user request).

FIG. 1 illustrates a portion of a network architecture according to example embodiments.

Referring to FIG. 1, the portion of the network architecture includes a central cache controller 602 in two-way communication with a network orchestrator 600, a global bitstream database (GBD) (or other central repository) 102 and a set of network nodes Node 1, Node 2, Node 3, . . . , Node n–2, Node n–1, Node n.

The network orchestrator 600 is generally known, and thus, a detailed discussion is omitted for the sake of brevity.

The GBD 102 is a central repository for FPGA bitstreams for FPGAs at the network nodes Node 1, Node 2, Node 3, . . . , Node n–2, Node n–1, Node n. The GBD 102 may reside in a shared memory. In one example, the GBD 102 may be thought of as a shared bitstream Look-Up Table (LUT), where bitstreams are retrieved based on unique pointers (or references) associated with the bitstreams. In a more specific example, the GBD 102 may be a distributed database managed by a distributed database management system (DDBMS). As discussed in more detail later, the pointers may be assigned by the central cache controller 602 such that bitstreams likely to be executed at the same node (e.g., concurrently and/or simultaneously) are assigned similar pointers.

Among other functionality, the central cache controller 602 manages storage of applications in cache architectures. Further example functionality of the central cache controller 602 will be discussed later.

Figure 2:
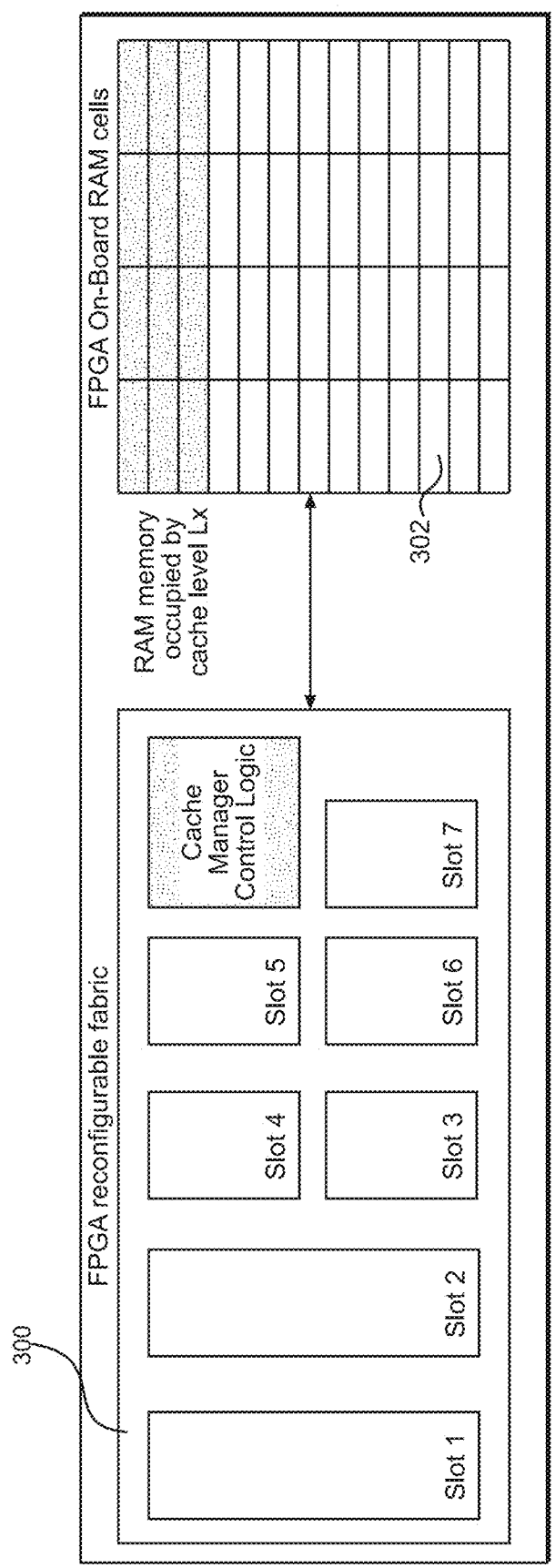
FIG. 2 illustrates a cache according to example embodiments.
Figure 3:
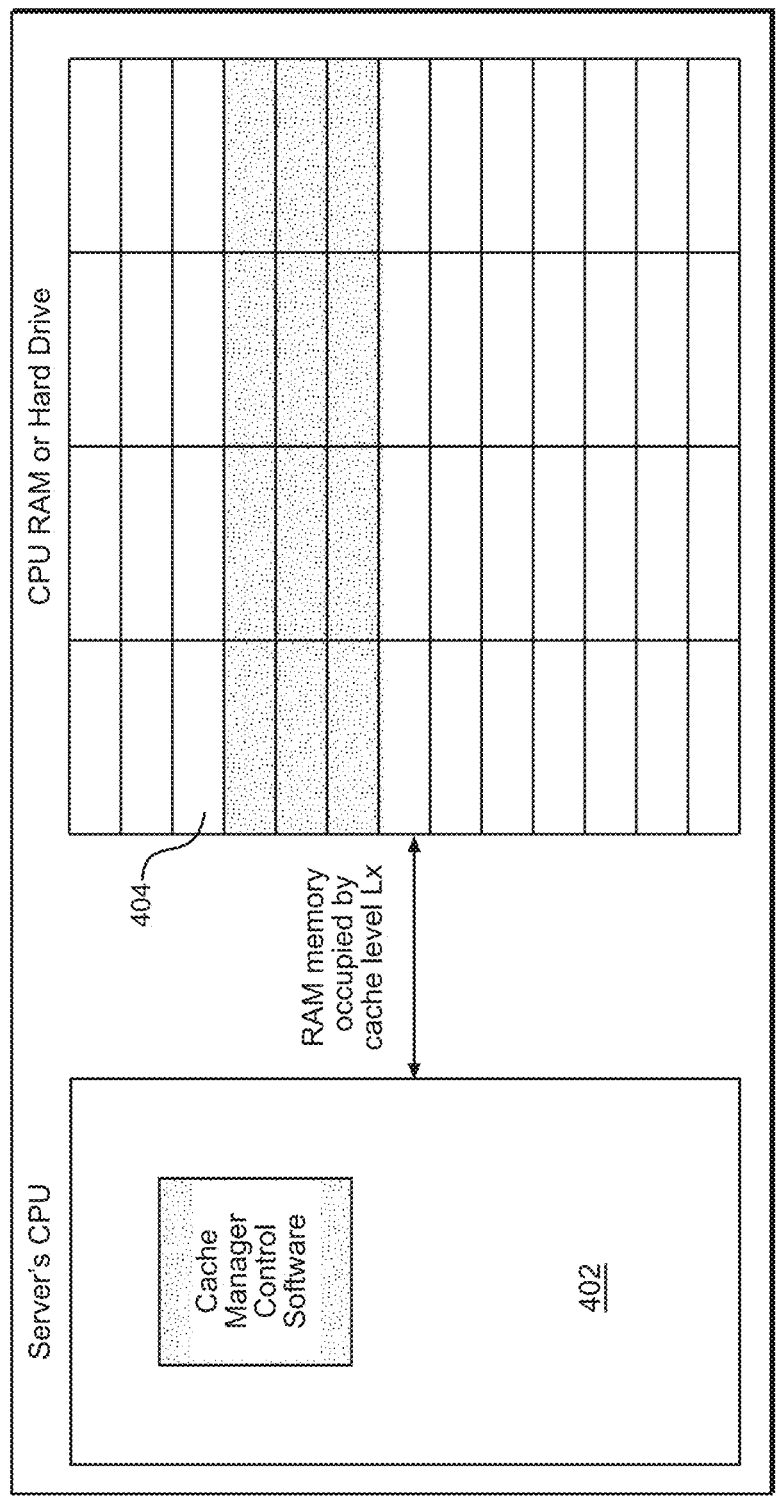
FIG. 3 illustrates another cache according to example embodiments.

Each of the network nodes shown in FIG. 1 may include, among other things, at least one level Lx cache of a multi-level cache hierarchy. The level Lx cache may include a cache manager 604 and a cache memory (FIGS. 2-4). The cache manager 604 interfaces with the central cache controller 602 to perform various tasks to manage the cache at the respective network node. Further example functionality of the cache manager 604 will be described in more detail later.

FIGS. 2 and 3 illustrate caches according to example embodiments.

In more detail, FIG. 2 illustrates an example embodiment in which the cache manager (e.g., cache manager 604) is implemented in a slot on a FPGA 300 (hardware cache manager or cache manager control logic). In the example embodiment shown in FIG. 2, the cache manager at the FPGA 300 interfaces with the cache memory 302, which, in this example, is embodied by FPGA on-board RAM cells.

The block diagram shown in FIG. 2 illustrates an almost empty configuration of a FPGA including eight slots, according to example embodiments. In this example, slots 1-7 are prepared to each host the execution of a network service or application, and slot 8 (cache manager control logic) is reserved to host the cache manager (or cache manager control logic) for a cache at a level of the cache hierarchy.

Although the example embodiment shown in FIG. 2 includes eight slots, example embodiments should not be limited to this example.

FIG. 3 illustrates an example embodiment in which the cache manager (e.g., cache manager 604) is implemented via software on a CPU 402 at, for example, a server (software cache manager or cache manager control software). In this example, cache manager at the server interfaces with the cache memory 404, which may be embodied by CPU RAM or a hard drive at a server.

FIG. 4 shows a generic internal architecture of a cache memory according to example embodiments.

In the example embodiment shown in FIG. 4, each line in the cache memory is divided in two types of fields: identification related fields and cache management fields.

Identification related fields are used to access the cache and identify a specific bitstream.

Cache management fields are specific to the currently implemented cache management policy used to handle hits, misses, eviction (clearing) of bitstreams, etc.

In the example embodiment shown in FIG. 4, the identification related fields include: <FPGA model>, <Provider>, <Shell Type>, <Bitstream>, and <Bitstream Pointer>.

The <FPGA model> field includes code that uniquely identifies a FPGA.

The <Provider> field specifies the producer of the bitstream.

The <Shell Type> field is a code that denotes the type of design for which the FPGA was prepared, for example, the number of users and the amount of reconfigurable resources per user (e.g., Configurable Logic Blocks (CLBs), memory blocks, Digital Signal Processors (DSPs), etc.). In the example shown in FIG. 4, the code 3U_TYPE denotes a FPGA that was prepared to host 3 identical partitions, each for a different user. Similarly, the code 4U_TYPE denotes a FPGA that was prepared to host 4 identical partitions, each for a different user.

The <Partition ID> field includes an identifier for the user-specific partition within a FPGA design where the bitstream will be loaded and executed.

The <Bitstream> field includes the bitstream reconfiguration file (e.g., represented by its functionality, a web scale service denoted as a graph of network tasks).

The <Bitstream Pointer> field includes a pointer for the bitstream. As discussed in more detail herein, the bitstream pointer is used instead of addresses in traditional CPU caches to uniquely identify a bitstream (e.g., within the GBD 102).

Of the identification related fields, the <FPGA mode> field, the <Provider> field and the <Shell Type> field are static characteristics or static values indicative of static characteristics. These, as well as other, static characteristics will be discussed in more detail later.

Still referring to the example embodiment shown in FIG. 4, the cache management fields include: <VBit> and <FCounter>.

The <VBit> field includes the validity bit for the bitstream. The validity bit indicates whether a bitstream is currently valid or invalid. In one example, a bitstream may be marked as invalid when the deployment of the bitstream is changed by the network orchestrator due to an update/ request from a user. In more detail, if the network service corresponding to the bitstream referenced as ABC is cancelled by a user, then bitstream ABC is marked as invalid if it was loaded in the memory system prior to its cancellation request.

The <FCounter> field includes an integer that counts how many times the bitstream has been instantiated before being marked as invalid.

Referring back to FIG. 1, according to one or more example embodiments, at the central cache controller 602, each bitstream in the GBD 102 is mapped to a real vector (vector of real numbers) such that bitstreams with relatively high probabilities of being executed on a same node and at the same time (e.g., concurrently or simultaneously) or shortly thereafter are mapped to vectors relatively close to one another according to a metric (e.g., Euclidean distance). In the field of machine learning (ML), this approach is referred to as an embedding. The central cache controller 602 may utilize the learned embedding to select and prefetch bitstreams that have a relatively high probability of being (more likely to be) executed relatively close to (e.g., concurrently with or shortly after in the future) a requested bitstream or bitstreams. In one example, the central cache controller 602 may determine that respective bitstreams are relatively close to one another based on a threshold distance. According to example embodiments, the threshold distance may be based on the vector length (with vector length as maximum threshold). The threshold distance may be dynamically modified based on the number of misses (e.g., the threshold needs to be increased) or 100% hits with unused bitstreams (e.g., the threshold needs to be reduced). An example threshold distance may be a fraction of some geometric characteristics of the vector (e.g., the vector length). Thus, an example threshold may be one quarter of the vector length. On top of setting a threshold distance, a limit on the number of bitstreams to be loaded may also be set at the central cache controller 602. In one example, this limit may be set to about 10. However, example embodiments should not be limited to these examples.

According to one or more example embodiments, the central cache controller 602 learns a bitstream2vec mapping, which is a mapping of bitstreams to vectors of real numbers with N dimensions, wherein N is a (e.g., predefined) parameter. According to one or more example embodiments, values of N may be larger than 2 (e.g., N=50). The parameter N may be set by controlling a tradeoff between complexity and accuracy. Larger values of N may lead to higher degree of freedoms to scatter the bitstream vectors in a correct way, but computational demands increase as the value of N increases. The parameter N mail be set based on empirical evidence using, for example, a trial and error methodology.

In one example, if K is the number of bitstreams in a dataset, then an embedding matrix W of size K×N, where K=N=3, and in which rows correspond to bitstreams and columns correspond to components of the embedding vectors, may be given as shown below in Equation (1).

$$W = \begin{bmatrix} W_{1,1} & W_{1,2} & W_{1,3} \\ W_{2,1} & W_{2,2} & W_{2,3} \\ W_{3,1} & W_{3,2} & W_{3,3} \end{bmatrix} \quad (1)$$

In this example, the vector associated with the first bitstream is ($W_{1,1}$ $W_{1,2}$ $W_{1,3}$), the vector associated with the second bitstream is ($W_{2,1}$ $W_{2,2}$ $W_{2,3}$), and the vector associated with the third bitstream is ($W_{3,1}$ $W_{3,2}$ $W_{3,3}$).

Training of the embedding may be performed based on a dataset including pairs of bitstreams (also referred to as couples of bitstreams) associated with a binary label, which indicates if the two bitstreams were executed at the same time or not. This dataset may be constructed from images of bitstreams being executed at run time. In a training dataset, a pair of bitstreams may appear multiple times, possibly with different label values (e.g., due to different images). This is illustrated in Table 1 shown below.

TABLE 1

| Pairs of Bitstreams | Labels |
| --- | --- |
| ($b_A$, $b_B$) | 0 |
| ($b_C$, $b_D$) | 1 |
| ($b_A$, $b_B$) | 1 |

As shown in this example the pair of bitstreams ($b_A$, $b_B$) appears multiple times with different labels (0 and 1).

The occurrences and labels associated with a pair of bitstreams is related to the probability (or likelihood) of the bitstreams in the pair being executed together (e.g., concurrently and/or simultaneously). According to one or more example embodiments, the central cache controller 602 exploits this relationship to train the embedding matrix. At runtime, the central cache controller 602 periodically (e.g., after each FPGA reconfiguration) gathers snapshots of the caches and updates the dataset based on the images. A snapshot of caches is a list of bitstreams present in each cache at the network nodes at some instant.

According to example embodiments, the central cache controller 602 may use the snapshots of the caches taken periodically at runtime to create or update the dataset. For example, from these snapshots, the central cache controller 602 may sample pairs of bitstreams randomly and label the sampled pairs according to whether they are in a same node cache in a snapshot.

For example, at runtime, the central cache controller 602 may gather statistics/images/traces to update the dataset and/or embedding. According to at least some example embodiments, this may occur each time a new bitstream enters a cache, to learn its likelihood of simultaneous execution with the other bitstreams in the cache.

Because different embeddings exist, different snapshots of caches may be created for the different embeddings related to the leafs of a decision tree (discussed later). To update an existing dataset, the central cache controller 602 may, for example, replace the entire dataset or replace selected items in the existing dataset according to a given policy (e.g., remove oldest items), which may be set by a cloud provider. It is noted, however, that example embodiments should not be limited to the examples discussed herein, and that creating or updating the dataset may be done based on other techniques, and using snapshots serves only as an example.

The central cache controller 602 then updates the embedding matrix by online training based on the continuously updated dataset. Such online training enables continuous refinement of the embedding and tracking of bitstream statistics.

In a more specific example, according to example embodiments, the central cache controller 602 may periodically take images of the bitstreams being executed at the different nodes, and then update the dataset based on the current statistics of the bitstreams.

For example, the central cache controller 602 may add (or update) pairs of bitstreams ($b_1$, $b_2$) that are executed on a same node and at the same time (e.g., concurrently or simultaneously) to (in) the dataset with the corresponding label ($b_1$, $b_2$)=1. The central cache controller 602 may also add (or update) pairs of bitstreams ($b_1$, $b_2$) that are not executed on the same node or at the same time in the dataset with the corresponding label ($b_1$, $b_2$)=0. According to example embodiments, without proportion corresponding to the occurrence of the pairs of bitstreams being executed together, training may be biased.

Because the number of pairs of bitstreams may increase exponentially with the number of bitstreams, not all possible combinations of bitstreams need be considered. The central cache controller 602 may choose pairs of bitstreams, for example, randomly. Moreover, the central cache controller 602 may remove all pairs that involve bitstreams no longer in the database from the training dataset. According to one or more example embodiments, a policy that periodically removes pairs of bitstreams from the dataset to ensure a size constraint (e.g., remove the oldest pairs of bitstreams) may also be set.

According to one or more example embodiments, the central cache controller 602 may add/remove bitstreams to/from the GBD 102 (or database) without the need to re-train the embedding matrix. Indeed, if a bitstream is removed from the GBD 102, then the central cache controller 602 removes a corresponding row from the embedding matrix, which does not affect the other embedding vectors. If a bitstream is added to the GBD 102 (or dataset), then the central cache controller 602 adds a new row to the appropriate embedding matrix. Although added to the embedding matrix, the newly added row is not trained, but rather has some initial (e.g., random) value. As a result, the newly added row is ignored by the central cache controller 602 until a training is performed including the added row.

According to at least some example embodiments, the central cache controller 602 exploits the embedding matrix by finding or identifying rows that are (relatively) close to a given row (or set of rows) corresponding to a bitstream currently being executed (or requested to be executed) at a network node. Although not necessarily required based on the size of the GBD 102, to reduce computational demands for relatively large numbers of bitstreams K (e.g., a few hundreds of thousands), the central cache controller 602 may split the GBD 102 into several subsets based on static characteristics of the bitstreams.

As initially mentioned above with regard to FIG. 4, for example, static characteristics of the bitstreams may include shell type, application domain, FPGA Model or manufacturer, bitstream provider, or the like. Based on these static characteristics, the central cache controller 602 splits (or, alternatively, divides or groups) the bitstreams in the GBD 102 such that bitstreams from different subsets have no or only little chance of being executed on the same node (e.g., they cannot be run on a same node as they are from different FPGA manufacturers). In one example, the central cache controller 602 may group bitstreams having common (or the same) static characteristics into a respective subset. In the example in which the GBD 102 is in the form of one or more LUTs, the GBD 102 may be split into several LUTs, wherein each LUT includes bitstreams for a given subset (e.g., bitstreams having a specific one or more static characteristics). Alternatively, the central cache controller 602 may store groupings of bitstreams (e.g., bitstream identifiers) for the respective subsets of bitstreams.

The central cache controller 602 may then learn an embedding matrix per subset, instead of a single embedding matrix for the entire GBD 102.

To identify which bitstreams have a relatively high probability (likelihood) of being executed at the same time and on the same node as a bitstream b currently being executed (or requested), the central cache controller 602 may select the subset S containing the bitstream b, and then identify bitstreams associated with embedding vectors that are relatively close to the vector associated with bitstream b. In one example, the central cache controller 602 may identify bitstreams with embedding vectors less than a threshold distance from the vector associated with bitstream b as relatively close to bitstream b. As discussed similarly above, an example threshold distance may be a fraction of some geometric characteristics of the vector (e.g., the vector length). Thus, an example threshold may be one quarter of the vector length.

For example, the central cache controller 602 may select at least a first bitstream from the GBD 102 based on an indicator related to a probability of concurrent or simultaneous execution of the first bitstream and a second bitstream at a network node. The central cache controller 602 may then output the first bitstream to the network node for storage in the local cache memory at the network node and for execution upon request.

A more detailed discussion of example embodiments will now be provided. Although example embodiments may be discussed with regard to specific examples (e.g., the Euclidean metric given below in Equation (2)), example embodiments should not be limited to these examples.

For example purposes, as before, K is the number of bitstreams in the dataset (e.g., a subset S of the GBD 102 or the entire GBD 102 depending on size), and N is the dimension of the embedding space for the dataset. W is the embedding matrix having size K×N, and $w_b$ is the embedding vector of N real numbers associated with the bitstream b. $w_b$ is therefore a line in the embedding matrix W.

In this example, given two bitstreams $b_1$ and $b_2$, the distance d($b_1$, $b_2$) in the embedding space is given as shown below in Equation (2).

$$d(b_1, b_2) := |w_{b_1} - w_{b_2}|^2 \qquad (2)$$

From the embedding matrix W, an estimated joint probability distribution on bitstreams may be defined as shown below in Equation (3).

$$\hat{p}(b_1, b_2) = \sigma(\text{para\_a} - \text{para\_b} \cdot d(b_1, b_2)) \qquad (3)$$

Figure 9:
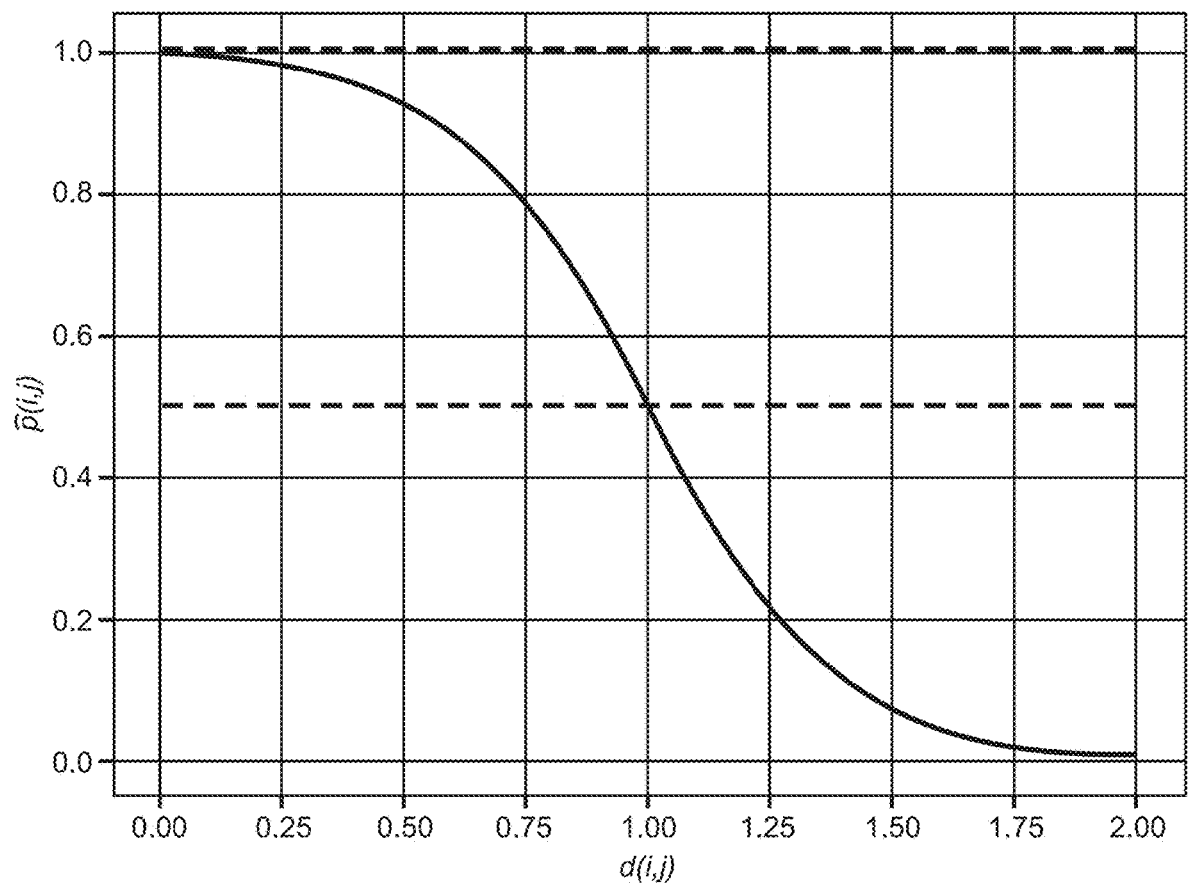
FIG. 9 is a graph illustrating an example relationship between joint probability and distance in an embedding space according to example embodiments.

In Equation (3), para_a and para_b are two real-valued positive parameters, and σ(.) is the sigmoid function. An example graph illustrating a relationship between the estimated joint probability $\hat{p}(b_1, b_2)$ and the distance d($b_1$, $b_2$) in the embedding space is shown in FIG. 9 for para_a=para_b=5. As shown, relatively large distances in the embedding space lead to relatively lower probabilities, and conversely lower distances lead to higher probabilities. Thus, the distance in the embedding space decreases as the probability increases.

The aim of the training process is to find and/or identify, for any pair of bitstreams ($b_1$, $b_2$), values for the embedding matrix W, para_a and para_b such that the estimated joint probability $\hat{p}(b_1, b_2)$ is a relatively close approximation of the actual joint probability p($b_1$, $b_2$) of the two bitstreams $b_1$ and $b_2$ being executed simultaneously and/or concurrently on the same node.

Once the training (e.g., optimization) process is complete, within the dataset, bitstreams indicated as having a relatively high probability of execution simultaneously and/or concurrently on a same node have corresponding embedding vectors that are relatively close to each other in the embedding space (a smaller distance $d(b_1, b_2)$), whereas bitstreams indicated as having a relatively low probability of execution together on the same node will have corresponding embedded vectors relatively far from each other in the embedding space (a larger distance $d(b_1, b_2)$).

A training process for the embedding matrix, according to example embodiments, will now be described in more detail below with regard to FIG. 5.

For the following discussion, we denote D as a dataset (training dataset) of pairs of bitstreams $(b_i, b_j)$, each associated with a binary label $l(b_i, b_j) \in \{0,1\}$. As explained above, a pair of bitstreams may be present in the dataset multiple times, with different label values. The occurrences and labels associated with a pair of bitstreams is relatively closely related to the probability of the two bitstreams of being executed together (e.g., concurrently or simultaneously) at a same node, which is exploited to train the embedding matrix. As mentioned above, the aim of the training process is to determine an embedding matrix W such that the estimated joint probability distribution $\hat{p}(b_i, b_j)$ is a relatively good approximation of the actual joint probability distribution $p(b_i, b_j)$ of the two bitstreams being simultaneously or concurrently executed on a same node. The dataset D serves as a proxy for the true probability $(b_i, b_j)$, which is unknown. The dataset D is therefore used to train the embedding matrix W.

According to one or more example embodiments, the parameters para_a and para_b may be generated (or optimized) either jointly with the embedding matrix W, as discussed below, or set to fixed values. In one example, the parameters para_a and para_b may be determined by a trial and error methodology. Example fixed values for parameters para_a and para_b may be 0.5.

Figure 5:
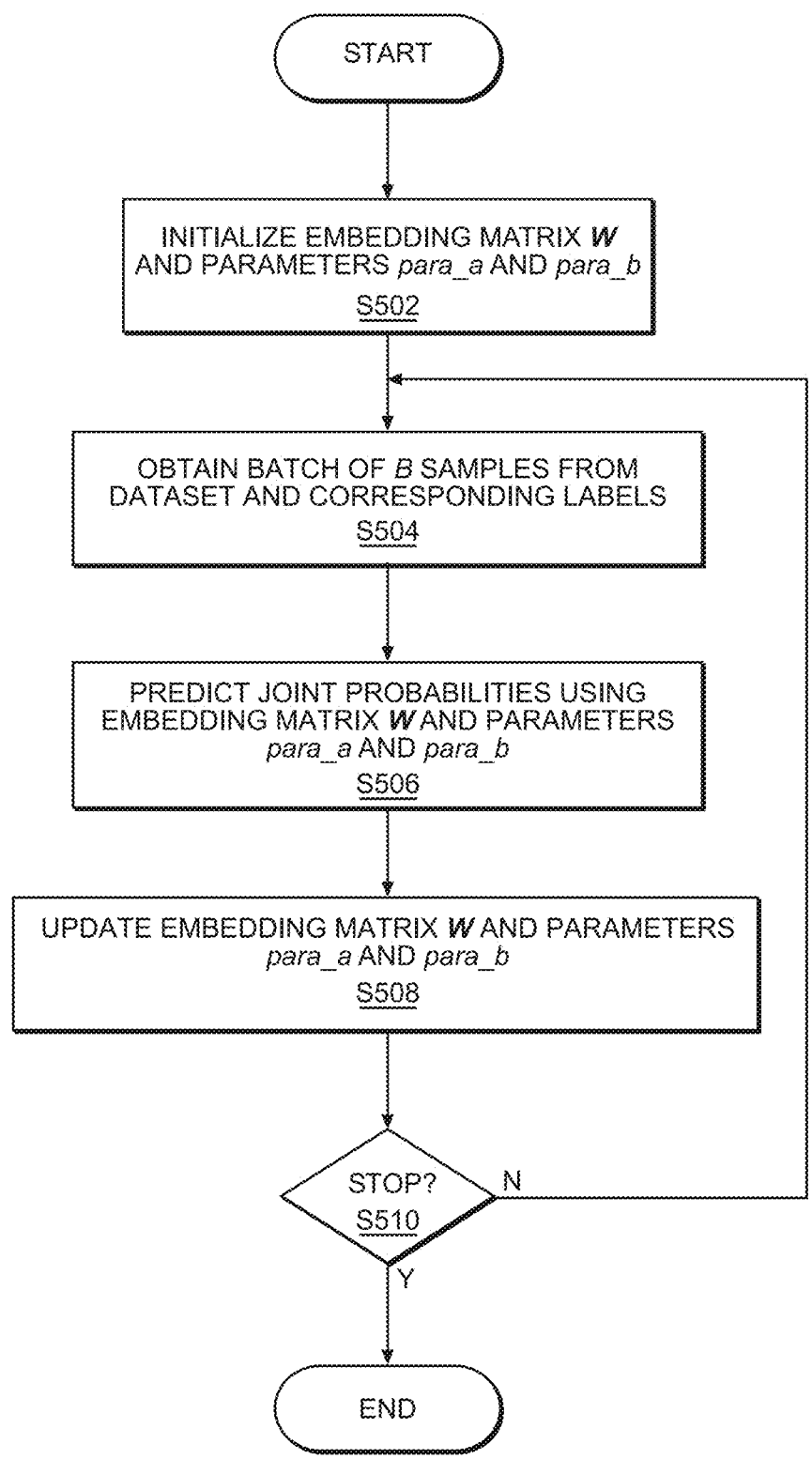
FIG. 5 is a flow chart illustrating a method according to example embodiments.

FIG. 5 is a flow chart illustrating a method for training an embedding matrix according to example embodiments. The method shown in FIG. 5 may be performed at the central cache controller 602. However, example embodiments should not be limited to this example. Moreover, the example embodiment shown in FIG. 5 will be described with regard to operations performed by the central cache controller 602. However, it should be understood that the example embodiment may be described similarly with regard to the operations being performed by at least one processor in conjunction with at least one memory and computer program code stored in the at least one memory, wherein the at least one memory and the computer program code are configured to, with the at least one processor, to cause the central cache controller to perform the respective operations.

Referring to FIG. 5, at step S502, the central cache controller 602 initializes the embedding matrix W and parameters para_a and para_b. According to example embodiments, the parameters para_a and para_b may be set to 0.5, or randomly initialized using a known algorithm for initialization (e.g., Glorot or the like).

At step S504, the central cache controller 602 obtains a batch of B sample pairs of bitstreams from the dataset $D: \{(b_1^{(i)}, b_2^{(i)})\}$, $i=1, \ldots B$, and their corresponding labels $l(b_1^{(i)}, b_2^{(i)})$. According to example embodiments, the central cache controller 602 may utilize random uniform selection to obtain the batch of B samples. The batch size B may range from about 64 to about 1000 depending on the available resources. Smaller batch sizes may require less memory and allow faster iteration, but may result in a noisier gradient estimate.

At step S506, the central cache controller 602 predicts (or estimates) joint probabilities $\hat{p}(b_1^{(i)}, b_2^{(i)})$ using the embedding matrix W and the parameters para_a and para_b. More specifically, for example, the central cache controller 602 computes estimated joint probabilities $\hat{p}(b_1^{(i)}, b_2^{(i)})$ for the B sample pairs based on Equations (2) and (3) discussed above.

At step S508, the central cache controller 602 updates the embedding matrix W and parameters para_a and para_b based on the estimated joint probabilities $\hat{p}(b_1^{(i)}, b_2^{(i)})$. According to at least one example embodiment, the central cache controller 602 updates the embedding matrix W and parameters para_a and para_b by performing one step of stochastic gradient descent (SGD) on the loss function L given by Equation (4) shown below.

$$L = -\frac{1}{B} \sum_{i=1}^{B} (l(b_1^{(i)}, b_2^{(i)}) \log(\hat{p}(b_1^{(i)}, b_2^{(i)})) + (1 - l(b_1^{(i)}, b_2^{(i)})) \log(1 - \hat{p}(b_1^{(i)}, b_2^{(i)}))) \quad (4)$$

The learning rate, batch size, and possibly other parameters of the SGD variant (Adam, RMSProp, etc. . . . ) may be optimization hyperparameters, and default parameters for the SGD variant may be used. It is noted that example embodiments should not be limited to the example training algorithm discussed herein. Rather, other algorithms, such as reinforcement learning, genetic algorithms, or the like, may be used.

At step S510, the central cache controller 602 determines whether to stop or terminate the training process based on a stop criterion. According to example embodiments, the stop criterion may take multiple forms. In one example, the stop criterion may be a threshold number of iterations of the training process shown in FIG. 5, or a determination that the loss function L has not decreased for a threshold number of iterations of the training process. In one example, the threshold number of iterations may be based on the convergence speed. In one example, the threshold number of iterations may be about 100,000 iterations.

If the central cache controller 602 determines that another iteration of the training process is needed, then the process returns to step S504 and continues as discussed above. Otherwise, the process terminates.

Although discussed herein with regard to training being performed at the central cache controller 602, example embodiments should not be limited to this example. Rather, the training discussed herein may be performed at another network device (e.g., server) and provided to the central cache controller 602 as needed.

Once the embedding matrix is trained, the central cache controller 602 and the cache manager 604 may exploit the learned embedding to prefetch bitstreams from the GBD 102 by determining which bitstreams in the GBD 102 have relatively high probabilities (e.g., greater than a threshold level) of execution during or soon after (simultaneous, concurrent or in the future) a given bitstream (e.g., executed or requested for execution) at a given node.

Figure 6:
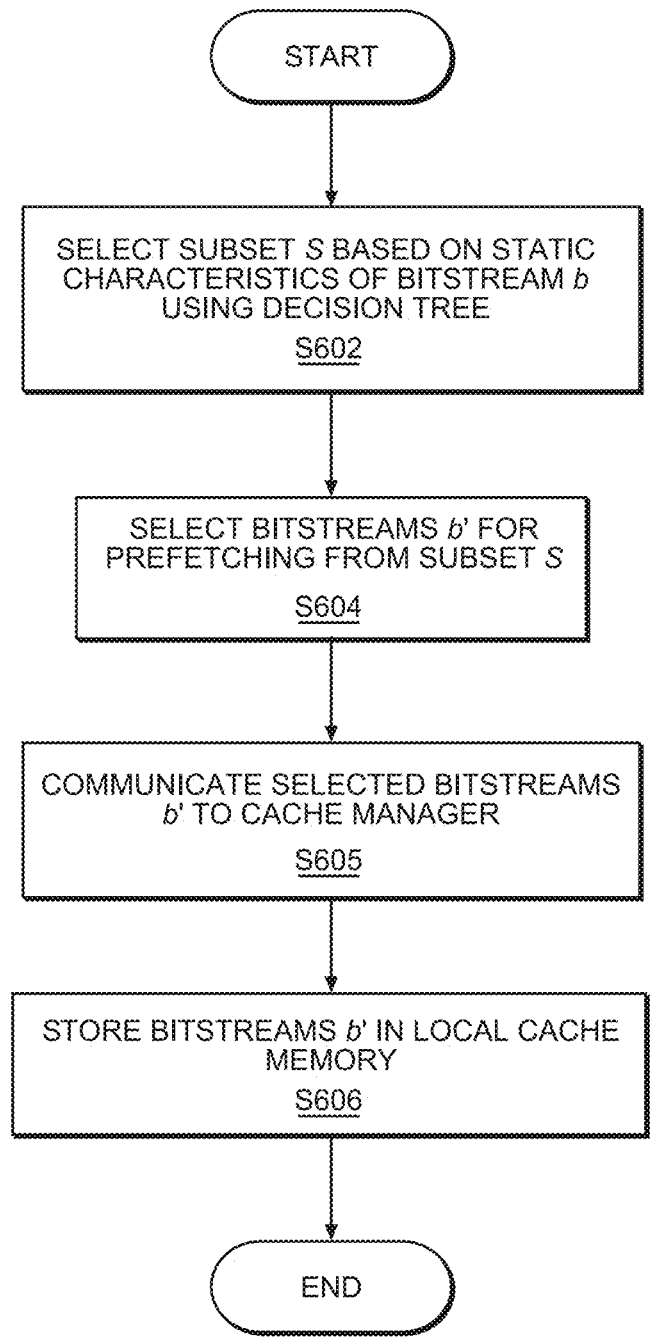
FIG. 6 is a flow chart illustrating another method according to example embodiments.

FIG. 6 is a flow chart illustrating a method for prefetching bitstreams according to example embodiments. For example purposes, the example embodiment shown in FIG.

6 will be discussed with regard to the architecture shown in FIG. 1. However, example embodiments should not be limited to this example.

Referring to FIG. 6, at step S602, the central cache controller 602 selects a subset S of bitstreams in the GBD 102 based on the static characteristics of a requested (or currently executed) bitstream b. In one example, the request for execution of the bitstream b may be received from the network orchestrator 600.

As mentioned above, according to example embodiments, the GBD 102 may be split into subsets according to the static characteristics of the bitstreams. As also discussed above, examples of static characteristics include, for example, the application domain, FPGA manufacturer, bitstream provider, shell type, or the like. Based on these static characteristics, the central cache controller 602 builds a decision-tree, which is then used to select a subset S of bitstreams. The central cache controller 602 may build the decision tree in any known manner (e.g., using a C4.5 algorithm, an ID3 algorithm, or the like). An example decision tree is shown in FIG. 7.

Although discussed herein with regard to the decision tree being generated by the central cache controller 602, example embodiments should not be limited to this example. Rather, the decision tree may be generated at another network device (e.g., server) and provided to the central cache controller 602 as needed.

Figure 7:
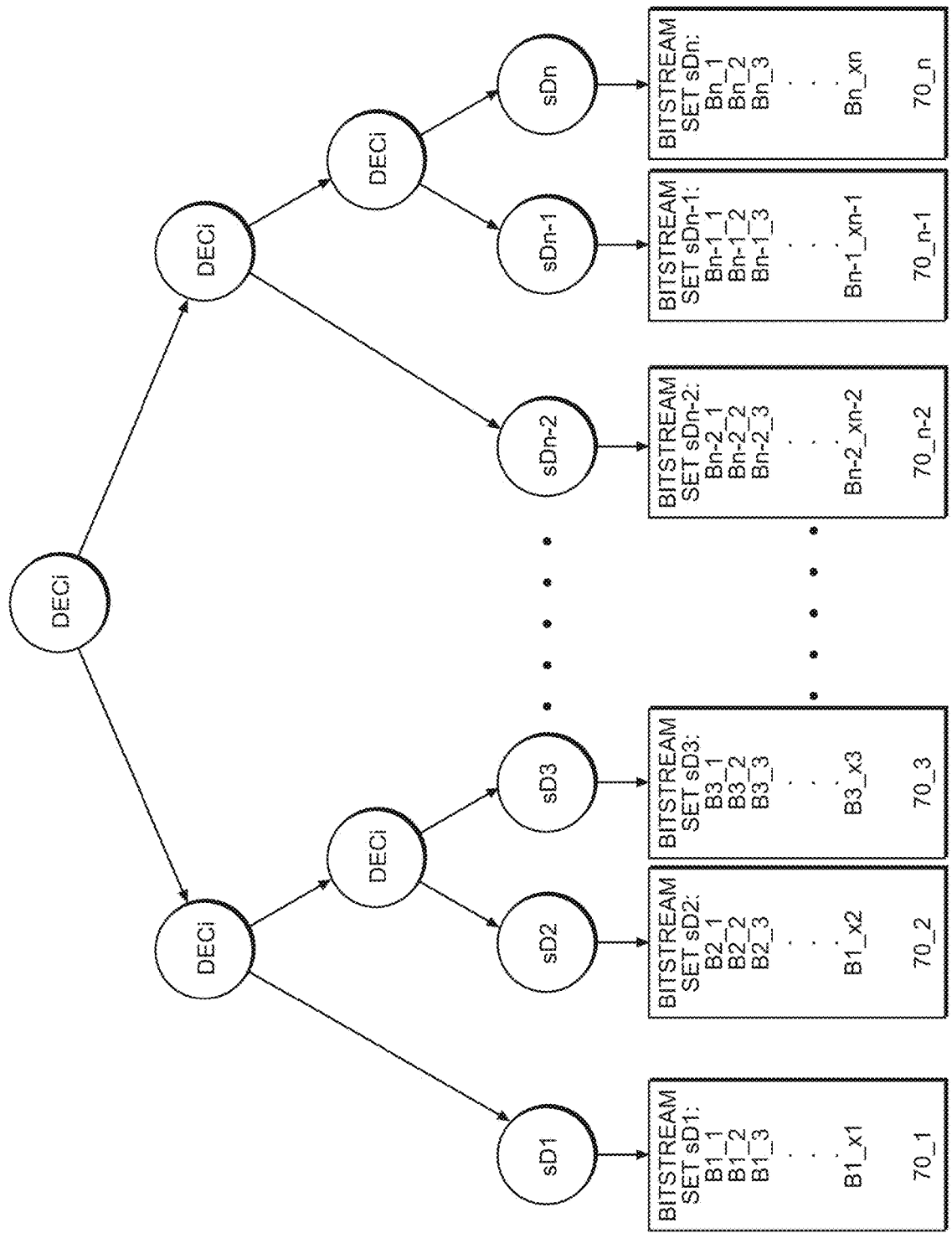
FIG. 7 illustrates a decision tree according to example embodiments.

Referring to FIG. 7, the decision tree includes a plurality of decision tree level nodes DECi and plurality of bitstream subset nodes sD1, sD2, sD3, . . . sDn−2, sDn−1, sDn.

Each node DECi, sD1, sD2, sD3, . . . sDn−2, sDn−1, sDn of the decision tree corresponds to a decision rule based on the static characteristics of bitstreams. The outcomes are used to select one of the sub-trees of the node. Each leaf of the decision tree corresponds to a respective subset of bitstreams 70_1, 70_2, 70_3, . . . , 70_n−2, 70_n−1, 70_n in the GBD 102. As discussed above, embeddings are learned for each individual subset instead of for the entire database using example embodiments discussed herein.

Returning to step S602 in FIG. 6, the central cache controller 602 parses through the decision-tree based on the static characteristics of the bitstream b to select a subset S of bitstreams.

At step S604, the central cache controller 602 selects, from the subset S, bitstreams b' with embedding vectors $w_b'$ relatively close to the embedding vector $w_b$ for the bitstream b in the embedding space W. More generally, the central cache controller 602 selects the bitstreams b' based on an indicator associated with a probability of concurrent, simultaneous or future execution of the bitstreams b' and the bitstream b. In this regard, the indicator may refer to the distance between the vector associated with bitstream b and the vectors associated with the bitstreams b', which are based on the embedding space (or matrix) W.

In at least one example embodiment, the central cache controller 602 may assign references (pointers) to the bitstreams based on the probability (or likelihood) that respective bitstreams may be executed concurrently, simultaneously or one after the other, at a network node. The assigned references may be relatively close (in terms of distance in the pointer space) such that the central cache controller 602 may select bitstreams b' based on the distance between the pointers associated with the bitstreams b' and the pointer associated with the bitstream b. In one example, bitstreams associated with pointers adjacent to a pointer associated with the bitstream b may be selected as the bitstreams b'.

The central cache controller 602 may assign references (pointers) to bitstreams using hash function(s), which is/are designed to assign similar outputs for a given set of inputs and to avoid collisions between newly generated pointers and existing (old) pointers.

As is the case when fetching closed data from memory based on addresses, fetching bitstreams from memory according to one or more example embodiments may be based on pointers with closed values. The central cache controller 602 may store bitstreams and pointers in a LUT.

A more detailed discussion of pointer generation is provided below.

According to one or more example embodiments, the central cache controller 602 may generate a pointer for a bitstream by combining (e.g., concatenation of) of a static (fixed) part and a dynamic part (that evolves at run-time).

The central cache controller 602 may generate the static part (value v1) by applying a hash function $f1$ to the static characteristics $Char_{Static}$ of the bitstream as shown below in Equation (5).

$$f1(Char_{Static}) = v1 \quad (5)$$

The central cache controller 602 may generate the dynamic part (value v2) by applying another (e.g., different) hash function $f2$ to the utilization frequency of a bitstream (bitstream B utilization frequency) as shown below in Equation (6).

$$f2(\text{bitstream } B \text{ utilization frequency}) = v2 \quad (6)$$

According to one or more example embodiments, any suitable hash function may be used to generate the static and dynamic parts. For example, if the static and dynamic characteristics of a bitstream are encoded as positive integers, then "modular hashing" may be used. In this example, the array size of the hash table is chosen to be a prime number M, and for any key value l (in this case the static or dynamic characteristic of a bitstream), the modular hashing algorithm computes the hash value (v1 in Equation (5) or v2 in Equation (6)) as the remainder of the l/M. Efficient modular hashing functions take as input the binary representation of keys. The same method may also be applied to compute the joint hash value of both static and dynamic characteristics, altogether (with a single hash operation). In this case, the key l is given by the integer that results from the juxtaposition of the integer key for the static characteristic and the integer for the dynamic characteristic of a bitstream.

The central cache controller 602 may then generate the pointer pointer for a bitstream based on the static part v1 and the dynamic part v2. According to one or more example embodiments, the central cache controller 602 may combine the static part v1 and the dynamic part v2 to generate the pointer pointer as shown below in Equation (7).

$$\text{pointer} = v1v2 \quad (7)$$

In at least one example, the central cache controller 602 may generate the pointer pointer by simple combination (juxtaposition) of the static part v1 and the dynamic part v2, where the left-most X bits of the pointer pointer are given by the static part v1 and the right-most Y bits of the pointer pointer are given by the dynamic part v2.

In a more specific example, assume three bitstreams A, B, C are identified as likely to be executed together at a given network node. In this instance, the central cache controller 602 may assign "similar" pointers, for example, A=0x004, B=0x008, C=0x00C, to the respective bitstreams. In this case, if bitstream A is requested for execution at a network node, then the central cache controller 602 may prefetch bitstreams B and C based on their relatively close proximity to bitstream A in the pointer space.

Referring still to FIG. 6, at step S605, the central cache controller 602 communicates the selected bitstreams b' to the cache manager 604 at the respective network node. The selected bitstreams b' may be communicated in any well-known manner.

At step S606, the cache manager 604 stores the bitstreams b' in the local cache memory at the network node. Once stored, the cache manager 604 may retrieve the bitstreams b' as needed in response to user requests.

Although the example embodiment shown in FIG. 6 is described with regard to a subset of bitstreams at the GBD 102, the method may be applicable to the entire GBD 102 depending on the size of the GBD 102. In this example, step S602 may be omitted and the subset S may include all or substantially all bitstreams at the GBD 102.

According to one or more example embodiments, specific hardware or software management solutions need not be deployed. Rather, example embodiments may be implemented with the existing hardware and software mechanisms of traditional caches, already installed/deployed in networks (e.g., associativity, replacement algorithms, cache coherence protocols, etc.).

One or more example embodiments allow for training to be carried out continuously as a background task based on newly gathered information for the bitstreams. This may allow the embeddings to be updated dynamically along with the bitstream statistics. As another example, the central cache controller 602 may run a number of iterations of the training process after each update of a given dataset.

According to example embodiments, using an embedding, bitstreams are mapped to respective vectors in an embedded space, such that the more likely bitstreams are to be executed together, the closer their respective vectors are in the embedded space according to a given, desired and/or pre-defined distance metric. Thus, as discussed herein, the reference to a probability that the more likely bitstreams are to be executed together may refer to a likelihood that the bitstreams are to be executed together, rather than probability in the strict sense. In this regard, the selecting of bitstreams b' may be referred to as being based on an indicator associated with a probability of concurrent, simultaneous or future execution of the bitstreams.

According to example embodiments, selecting a subset of bitstreams from the central repository may be performed when the central repository is relatively large to avoiding examining embeddings that are too large. However, such selection may not be necessary depending on the size of the central repository.

As discussed herein, according to one or more example embodiments, an embedding is used to map each bitstream to a vector in the embedded space, such that the more likely are bitstreams to be executed together, the closer their respective vector will be in the embedded space according to some pre-defined distance metric. One possible wording is "estimated indicator related to the probability of . . . "]

Figure 8:
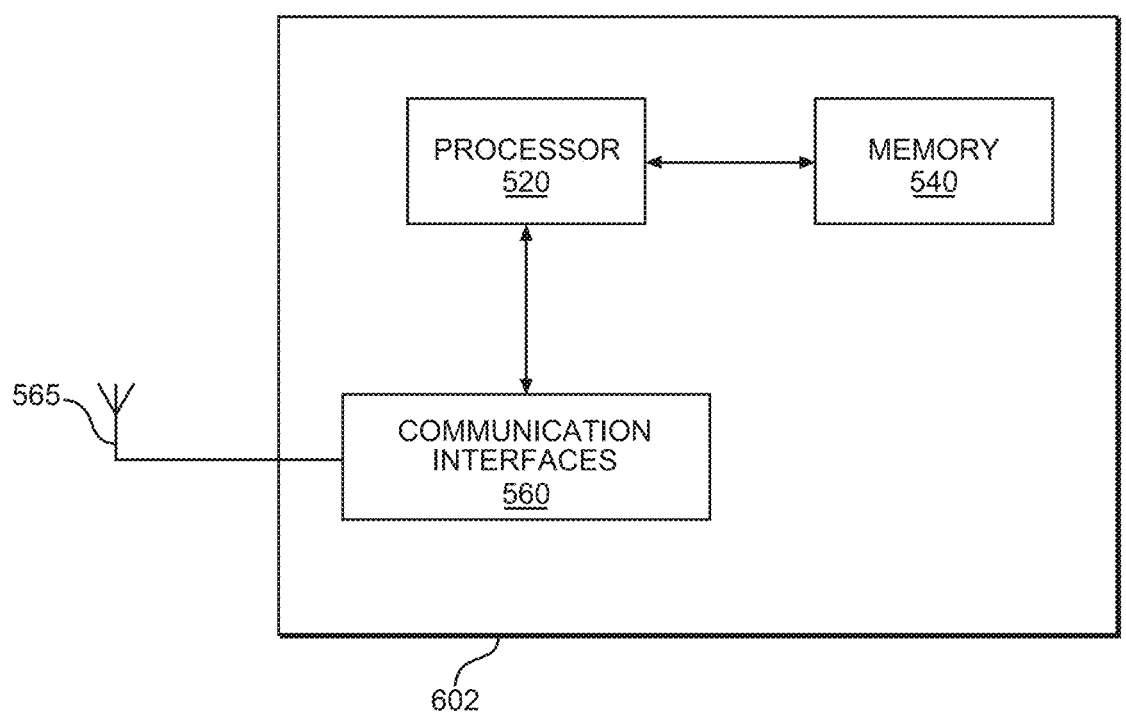
FIG. 8 illustrates a network device.

FIG. 8 illustrates an example embodiment of a central cache controller 602. Although a central cache controller is discussed, the structure shown in FIG. 8 may also serve as the network orchestrator 600, GBD 102 and/or network node shown in FIG. 1.

As shown, the central cache controller 602 includes: a memory 540; a processor 520 connected to the memory 540; various interfaces 560 connected to the processor 520; and one or more antennas or antenna panels 565 connected to the various interfaces 560. The various interfaces 560 and/or the antenna 565 may constitute a transceiver for transmitting/receiving data from/to other network nodes and/or LANs via a wired or wireless links. As will be appreciated, depending on the implementation of the central cache controller 602, the central cache controller 602 may include many more components than those shown in FIG. 8. However, it is not necessary that all of these generally conventional components be shown in order to disclose the illustrative example embodiment.

The memory 540 may be a computer readable storage medium that generally includes a random access memory (RAM), read only memory (ROM), and/or a permanent mass storage device, such as a disk drive. The memory 540 also stores an operating system and any other routines/modules/applications for providing the functionalities of the central cache controller 602 (e.g., functionalities of a network node, such as a server, a router, a switch, component or element of a 5th Generation telecommunications network, etc., methods according to the example embodiments, etc.) to be executed by the processor 520. These software components may also be loaded from a separate computer readable storage medium into the memory 540 using a drive mechanism (not shown). Such separate computer readable storage medium may include a disc, tape, DVD/CD-ROM drive, memory card, or other like computer readable storage medium (not shown). In some example embodiments, software components may be loaded into the memory 540 via one of the various interfaces 560, rather than via a computer readable storage medium.

The processor 520 may be configured to carry out instructions of a computer program by performing the arithmetical, logical, and input/output operations of the system. Instructions may be provided to the processor 520 by the memory 540.

The various interfaces 560 may include components that interface the processor 520 with the antenna 565, or other input/output components. As will be understood, the various interfaces 560 and programs stored in the memory 540 to set forth the special purpose functionalities of the central cache controller 602 will vary depending on the implementation of the central cache controller 602. The interfaces 560 may also include one or more user input devices (e.g., a keyboard, a keypad, a mouse, or the like) and user output devices (e.g., a display, a speaker, or the like).

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

As discussed herein, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at, for example, existing network apparatuses, elements or entities including cloud-based data centers, computers, cloud-based servers, or the like. Such existing hardware may be processing or control circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium," "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine-readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks. For example, as mentioned above, according to one or more example embodiments, at least one memory may include or store computer program code, and the at least one memory and the computer program code may be configured to, with at least one processor, cause a network apparatus, network element or network device to perform the necessary tasks. Additionally, the processor, memory and example algorithms, encoded as computer program code, serve as means for providing or causing performance of operations discussed herein.

A code segment of computer program code may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable technique including memory sharing, message passing, token passing, network transmission, etc.

The terms "including" and/or "having," as used herein, are defined as comprising (i.e., open language). The term "coupled," as used herein, is defined as connected, although not necessarily directly, and not necessarily mechanically. Terminology derived from the word "indicating" (e.g., "indicates" and "indication") is intended to encompass all the various techniques available for communicating or referencing the object/information being indicated. Some, but not all, examples of techniques available for communicating or referencing the object/information being indicated include the conveyance of the object/information being indicated, the conveyance of an identifier of the object/information being indicated, the conveyance of information used to generate the object/information being indicated, the conveyance of some part or portion of the object/information being indicated, the conveyance of some derivation of the object/information being indicated, and the conveyance of some symbol representing the object/information being indicated.

According to example embodiments, network apparatuses, elements or entities including cloud-based data centers, computers, cloud-based servers, or the like, may be (or include) hardware, firmware, hardware executing software or any combination thereof. Such hardware may include processing or control circuitry such as, but not limited to, one or more processors, one or more CPUs, one or more controllers, one or more ALUs, one or more DSPs, one or more microcomputers, one or more FPGAs, one or more SoCs, one or more PLUs, one or more microprocessors, one or more ASICs, or any other device or devices capable of responding to and executing instructions in a defined manner.

Benefits, other advantages, and solutions to problems have been described above with regard to specific embodiments of the invention. However, the benefits, advantages, solutions to problems, and any element(s) that may cause or result in such benefits, advantages, or solutions, or cause such benefits, advantages, or solutions to become more pronounced are not to be construed as a critical, required, or essential feature or element of any or all the claims.

Reference is made in detail to embodiments, examples of which are illustrated in the accompanying drawings, wherein like reference numerals refer to the like elements throughout. In this regard, the example embodiments may have different forms and should not be construed as being limited to the descriptions set forth herein. Accordingly, the example embodiments are merely described below, by referring to the figures, to explain example embodiments of the present description. Aspects of various embodiments are specified in the claims.

What is claimed is:

1. A network-based apparatus comprising:
   at least one processor; and
   at least one memory including computer program code, the at least one memory and the computer program code configured to, with the at least one processor, cause the network-based apparatus to
   select at least a first bitstream from a central repository based on an indicator associated with a probability of concurrent, simultaneous or future execution of the first bitstream and a second bitstream, each of the first bitstream and the second bitstream including programming information for a device at the network node, and the indicator being based on an embedding matrix including at least a subset of bitstreams in the central repository mapped to an N-dimensional vector of real numbers, and
   output the first bitstream to the network node for storage and execution in response to a request at the network node for the second bitstream for execution.

2. The network-based apparatus of claim 1, wherein
   the embedding matrix maps bitstreams in the subset of bitstreams to the N-dimensional vector of real numbers, and
   the at least one memory and the computer program code are configured to, with the at least one processor, cause the network-based apparatus to
   identify the subset of bitstreams from among the bitstreams in the central repository, the subset of bitstreams including at least the first bitstream and the second bitstream, and
   select the first bitstream from the subset of bitstreams.

3. The network-based apparatus of claim 2, wherein the at least one memory and the computer program code are configured to, with the at least one processor, cause the network-based apparatus to identify the subset of bitstreams based on one or more static characteristics associated with the second bitstream.

4. The network-based apparatus of claim 3, wherein the one or more static characteristics include at least one of shell type, application domain, FPGA Model or manufacturer or bitstream provider.

5. The network-based apparatus of claim 2, wherein the at least one memory and the computer program code are configured to, with the at least one processor, cause the network-based apparatus to identify the subset of bitstreams according to a decision tree.

6. The network-based apparatus of claim 1, wherein the embedding matrix maps all bitstreams in the central repository to the N-dimensional vector of real numbers.

7. The network-based apparatus of claim 1, wherein
   each of the first bitstream and the second bitstream is assigned a pointer based on the indicator; and
   the at least one memory and the computer program code are configured to, with the at least one processor, cause the network-based apparatus to select the first bitstream based on the pointers assigned to the first bitstream and the second bitstream.

8. The network-based apparatus of claim 1, wherein
   the first bitstream is stored in a cache at the network node, and
   the at least one memory and the computer program code are configured to, with the at least one processor, cause the network-based apparatus to
   gather a list of bitstreams stored in the cache in response to storing the first bitstream in the cache at the network node, and
   update the embedding matrix based on the list of bitstreams stored in the cache.

9. The network-based apparatus of claim 1, wherein the device is a field programmable gate array (FPGA).

10. A method comprising:
    selecting at least a first bitstream from a central repository based on an indicator associated with a probability of concurrent, simultaneous or future execution of the first bitstream and a second bitstream, each of the first bitstream and the second bitstream including programming information for a device at the network node, and the indicator being based on an embedding matrix including at least a subset of bitstreams in the central repository mapped to an N-dimensional vector of real numbers; and
    outputting the first bitstream to the network node for storage and execution in response to a request at the network node for the second bitstream for execution.

11. The method of claim 10, wherein
    the embedding matrix maps bitstreams in the subset of bitstreams to the N-dimensional vector of real numbers, and
    the selecting includes
    identifying the subset of bitstreams from among bitstreams stored in the central repository, the subset of bitstreams including at least the first bitstream and the second bitstream, and
    selecting the first bitstream from the subset of bitstreams.

12. The method of claim 11, wherein the identifying identifies the subset of bitstreams based on one or more static characteristics associated with the second bitstream.

13. The method of claim 12, wherein the one or more static characteristics include at least one of shell type, application domain, FPGA Model or manufacturer or bitstream provider.

14. The method of claim 11, wherein the identifying identifies the subset of bitstreams according to a decision tree.

15. The method of claim 10, wherein the embedding matrix maps all bitstreams in the central repository to the N-dimensional vector of real numbers.

16. The method of claim 10, wherein
    each of the first bitstream and the second bitstream is assigned a pointer based on the indicator; and the selecting selects the first bitstream based on the pointers assigned to the first bitstream and the second bitstream.

17. The method of claim 10, wherein the device is a field programmable gate array (FPGA).

18. A non-transitory computer-readable storage medium storing computer-readable instructions that, when executed by at least one processor at a network-based apparatus, cause the network-based apparatus to perform a method comprising:
   selecting at least a first bitstream from a central repository based on an indicator associated with a probability of concurrent, simultaneous or future execution of the first bitstream and a second bitstream, each of the first bitstream and the second bitstream including programming information for a device at the network node, and the indicator being based on an embedding matrix including at least a subset of bitstreams in the central repository mapped to an N-dimensional vector of real numbers; and
   outputting the first bitstream to the network node for storage and execution in response to a request at the network node for the second bitstream for execution.

19. The non-transitory computer-readable storage medium of claim 18, wherein the selecting comprises:
   the embedding matrix maps bitstreams in the subset of bitstreams to the N-dimensional vector of real numbers, and
   the selecting includes
      identifying the subset of bitstreams from among bitstreams stored in the central repository, the subset of bitstreams including at least the first bitstream and the second bitstream, and
      selecting the first bitstream from the subset of bitstreams.

20. The non-transitory computer-readable storage medium of claim 18, wherein the device is a field programmable gate array (FPGA).

* * * * *